United States Patent [19]

Koenig

[11] 4,117,508
[45] Sep. 26, 1978

[54] PRESSURIZABLE SEMICONDUCTOR PELLET ASSEMBLY

[75] Inventor: Paul W. Koenig, Clyde, N.Y.

[73] Assignee: General Electric Company, Auburn, N.Y.

[21] Appl. No.: 779,327

[22] Filed: Mar. 21, 1977

[51] Int. Cl.$^2$ ............... H01L 23/02; H01L 23/28; H01L 23/42
[52] U.S. Cl. ................... 357/81; 357/72; 357/74; 357/80; 357/79
[58] Field of Search ............ 357/72, 74, 70, 80, 357/81, 79

[56] References Cited

U.S. PATENT DOCUMENTS

| | | | |
|---|---|---|---|
| 3,388,301 | 6/1968 | James | 357/74 |
| 3,414,968 | 12/1968 | Genser et al. | 357/80 |
| 3,763,403 | 10/1973 | Lootens | 357/70 |
| 3,783,347 | 1/1974 | Vladik | 357/72 |
| 3,846,823 | 11/1974 | Matthews et al. | 357/74 |
| 3,921,285 | 11/1975 | Krall | 357/74 |
| 4,009,485 | 2/1977 | Koenig | 357/70 |

Primary Examiner—Andrew J. James
Attorney, Agent, or Firm—R. J. Mooney; S. B. Salai

[57] ABSTRACT

Disclosed is a semiconductor body mounted on an electrically-insulative, thermally-conductive plate which also carries metallized contacts electrically connected to the various contact areas associated with the semiconductor body. A protective one-piece insulative bridge overlies the semiconductor body and includes legs secured to the plate and a cross member extending over the body. The bridge facilitates pressing or clamping the plate in enhanced heat-transferring relation to a substrate heatsink without application of any pressure on the body or other deleterious effects to the body.

5 Claims, 5 Drawing Figures

PRESSURIZABLE SEMICONDUCTOR PELLET ASSEMBLY

The present invention relates to improvements in semiconductor apparatus, and more particularly to improvements in low cost packaging of semiconductor devices such as power transistors, thyristors, and the like, facilitating the extraction of heat from such devices.

BACKGROUND OF THE INVENTION

With the development of effective, permanent, mechanically sturdy passivation of P/N junction semiconductor bodies such as those which constitute, for example, transistors, thyristors, and the like, considerable effort has been directed toward the goal of packaging such devices in an ultra low cost fashion which will nevertheless provide desired electrical insulation of the semiconductor body and its associated electrical leads from any heatsink on which it may ultimately be mounted. Another highly desired feature of such a packaging arrangement is one affording the ability to press or clamp the package firmly against such a heatsink, to enhance the flow of heat from the semiconductor body to the heatsink without mechanically damaging or developing excessive mechanical or other stresses in the semiconductor body.

Accordingly, one object of the invention is to provide an improved semiconductor apparatus of the foregoing character which is particularly suitable for manufacture at very low cost, yet provides electrical insulation of the semiconductor body and associated leads from any heatsink on which it may be mounted, as well as facilitating the clamping or pressing of the apparatus to the heatsink for enhanced heat transfer without deleterious effect on the semiconductor body.

Another object of the invention is to provide an improved semiconductor product of the foregoing character which is easy to assemble, and of which the material content is minimized for ultra low cost.

BRIEF SUMMARY OF THE INVENTION

According to the present invention, a semiconductor apparatus is provided in which the semiconductor body thereof, i.e., the pellet or die of semiconductor material containing suitably formed P/N junctions, is mounted on the top face of a plate of material which is electrically insulative and a good heat conductor. The plate in turn is adapted to have its bottom face pressed in heat-transferring relation against a substrate heatsink. On its top face, the plate carries the semiconductor body and related leads and contacts, as well as a one-piece insulative bridge forming a protective shield for the semiconductor body. The bridge includes legs which are secured to the plate and an integral cross member extending between the legs and overlying the semiconductor body in spaced relation therefrom. The bridge serves as an abutment against which a force may be applied to press or clamp the plate against the heatsink with the requisite pressure for desirable heat transfer, while avoiding any application of pressure to the semiconductor body or any deleterious effect on the body. In an alternative embodiment, the bridge serves as a support and cover for a mass of insulative encapsulant material filling the space beneath the cross member of the bridge and overlying the semiconductor body, and in yet another embodiment, the bridge itself carries upstanding rigid terminals interiorly connected to the several respective contacts associated with the body.

DESCRIPTION OF THE DRAWINGS

Other objects and features of the present invention will be more apparent from the following description and the accompanying drawing wherein.

DESCRIPTION OF THE PREFERRED EMBODIMENTS

Figure 2:
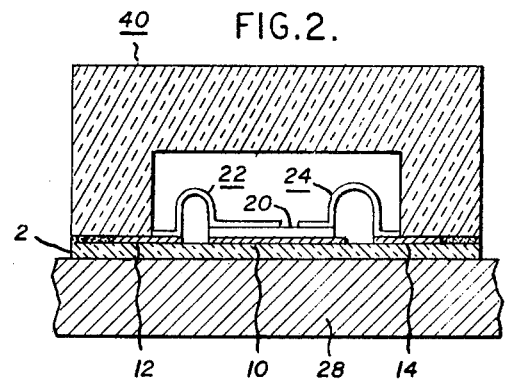
FIG. 2 is a vertical sectional view of the structure of FIG. 1 after complete assembly thereof, taken on line 2—2 thereof.
Figure 1:
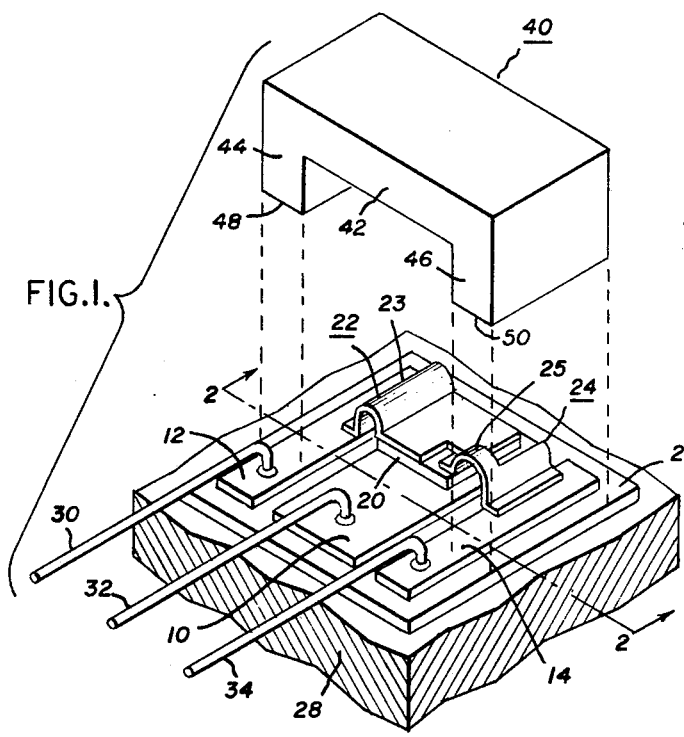
FIG. 1 is an exploded isometric view of one form of the present invention.

Referring to FIG. 1, an electrically insulative plate 2 of good thermal conductivity, made of a ceramic material such as aluminum oxide or beryllium oxide or the like, has bonded to its top major face a plurality of metallized areas which may be suitably solder coated and form respective individual spaced contacts 10, 12, and 14. Desirably, contacts 10, 12, and 14 have peripheral edges generally parallel to, and inwardly spaced from, the edges of the plate 2.

On the center contact 10 there is mounted a tablet-shaped semiconductor body or pellet 20 which may be of any desired type such as, for example, a silicon thyristor pellet, containing suitable P/N junctions and suitably passivated by glass, oxide, organic material, or some combination thereof, the details of which form no part of the present invention and are well known to the art. The body 20 has three external metallic contact regions, one of which is on its bottom major face and is joined by solder or the like to contact 10. Two other metallic contact regions on the top major face of body 20 are likewise joined by solder or the like to the inboard ends of respective ribbon-like metal leads 22 and 24. The outer ends of leads 22 and 24 are connected by solder or the like to the respective contacts 12 and 14. Each of leads 22 and 24 has a respective upstanding bight portion 23 and 25 for the purpose of dissipating any mechanical stresses between the ends of leads 22 and 24, such as may occur for example during the thermal cycling inherent in operation of the device. Individual flexible extensions of contact 10, 12, and 14 are provided by respective segments of soft copper wire or the like 30, 32, and 34, respectively connected by solder or the like to the contacts 12, 10, and 14.

The assembly thus far described has the desirable attributes of being composed of a minimum of parts and materials, being inexpensive and easy to assemble, yet providing an easily manipulated structure which can be installed or mounted for operation with the bottom major face of insulative plate 2 in heat-transferring relation with a suitable heat sink substrate, shown at 28.

One problem with the above described assembly, however, to the solution of which the present invention particularly relates, is the problem of pressing or clamping the plate 2 against heat sink substrate 28 with the desired amount of pressure for enhanced heat transfer, without crushing, cracking, or otherwise damaging the semiconductor body 20, the passivation materials thereon, and the leads 22 and 24.

The present invention solves this problem by provision of a sturdy bridge 40 of suitable electrically insulative material such as glass, ceramic, glass-reinforced resin, or the like. Bridge 40 has a thick protective cross member portion 42 extending over the semiconductor body 20 and leads 22, 24, and supported in upwardly spaced relation from the body 20 and leads 22, 24, and bight portions 23, and 25 by integral thick legs 44 and 46. The lower ends of legs 44 and 46 are provided with respective feet 48, 50 which engage and are adhesively or otherwise suitably bonded to the supporting portions of the upper major face of plate 2 and the adjacent portions of contacts 12, 14. The feet 48, 50 may if desired be specially contoured for complementary engagement with the uneven surfaces of plate 20 and the contacts 12, 14, as shown best in the embodiment of FIG. 3.

With the bridge 40 in place, as much as hundreds of pounds per square inch of pressure can be readily applied to cross member 42 to force the plate 2 firmly against its heatsink substrate 28, for enhanced heat transfer out of body 20, without deleterious effects on the remainder of the assembly.

Figure 3:
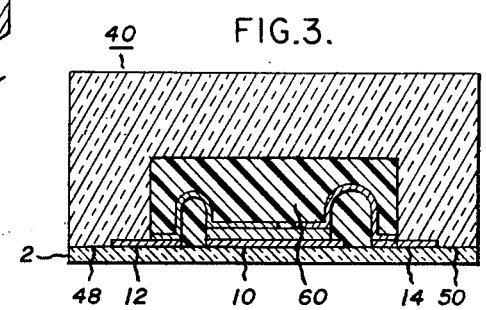
FIG. 3 is a view similar to FIG. 2 showing another embodiment of the invention.

In the alternative embodiment of FIG. 3, the space beneath the bridge 40 is filled with a suitable supplementary passivant and protective encapsulant 60 for the semiconductor body 20 and leads 22, 24. In cooperation with the bridge 40, addition of encapsulant 60 enables complete envelopment of the body 20 and leads 22, 24 for complete mechanical protection thereof at minimum cost and in a form which facilitates further handling, testing, shipping, installation, and similar manipulation and utilization of the apparatus.

Figure 4:
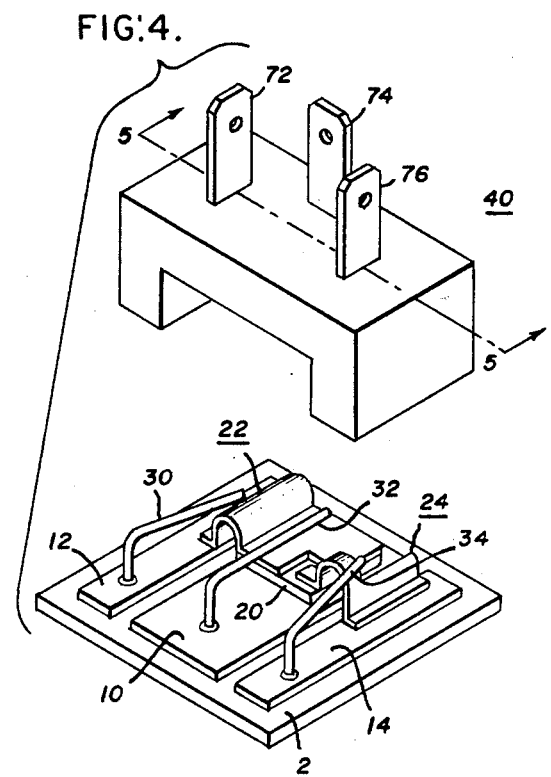
FIG. 4 is a view similar to FIG. 1 of yet another embodiment of the invention.
Figure 5:
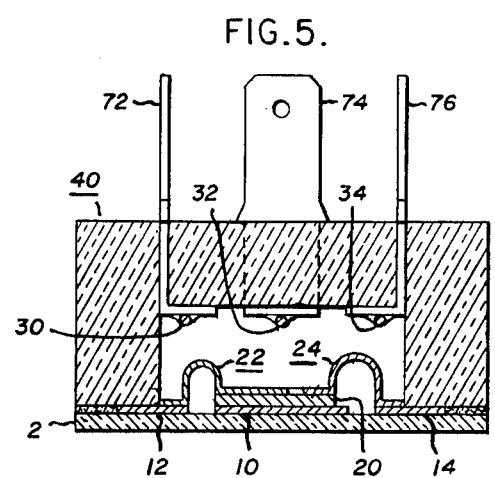
FIG. 5 is a view similar to FIG. 2 of the structure of FIG. 4 taken on line 5—5 of FIG. 5, and broken away to show certain details.

In the alternative embodiment of FIGS. 4 and 5, the bridge 40 serves additionally as a carrier for stiff upstanding prong-like external connectors 72, 74, 76 facilitating hook-up to external circuitry. The prongs are embedded in the material of the cross member 42, and mechanically supported and electrically insulated from each other thereby. Each of the three wire-like extensions 30, 32, 34 is joined, in any suitable fashion such as by solder or the like, to the inner end portion of a respective connector 72, 74, 76. The resulting structure of FIG. 5 is mechanically sturdy yet very low cost, affords desirable protection to the semiconductor body with a minimum of parts, and can be readily clamped or otherwise permanently bonded, by adhesive or solder or the like, to an underlying heatsink.

From the foregoing description, it will be evident that the present invention provides a semiconductor assembly having a minimum of parts and materials for ultra low cost, yet having an electrical insulative mounting for all of the contacts and leads associated with the semiconductor, as well as a protective bridge overlying the semiconductor body and affording sturdy low cost means facilitating clamping or pressing the assembly to a heatsink without adverse effect on the semiconductor body.

It will be appreciated in light of the foregoing teaching that the present invention may take a variety of forms, and accordingly, the scope of the invention is to be understood as defined by the following claims.

What is claimed is:

1. A semiconductor apparatus comprising:
   a plate of electrically insulative thermally conductive material having a bottom major face adapted to be pressed in heat-transferring relation against a substrate heatsink, said plate having a top major face provided with a plurality of metallized contacts;
   a semiconductor body having a bottom major face affixed to one of said contacts and connected to leads extending between contact regions on the top major face of said body and others of said contacts on said plate; and
   a one-piece insulative bridge carried by said plate including upstanding spaced legs connected by an integral cross member, said legs terminating at their bottom ends in feet secured to said plate and said cross member spanning said body in upwardly spaced relation to said body and said leads whereby the bottom face of said plate may be pressed against said heatsink by a force applied to said bridge without application of any pressure to said body.

2. A semiconductor apparatus as defined in claim 1 wherein the space beneath the cross member of said bridge and overlying said body is filled with an insulative encapsulant material.

3. A semiconductor apparatus as defined in claim 1 wherein said bridge carries upstanding terminals, and each of said terminals is electrically connected to one of said contacts.

4. A semiconductor apparatus as defined in claim 3 wherein the space beneath the cross member of said bridge and overlying said body is filled with an insulative encapsulant material.

5. A semiconductor apparatus comprising:
   a plate of electrically insulative thermally conductive material having a bottom major face adapted to be connected in heat-transferring relation to a substrate heatsink, said plate having a top major face provided with a plurality of metallized contacts;
   a semiconductor body having a bottom major face affixed to one of said contacts and connected to leads extending between contact regions on the top major face of said body and others of said contacts on said plate;
   a one-piece insulative bridge carried by said plate including upstanding spaced legs connected by an integral cross member, said legs terminating at their bottom ends in feet secured to said plate and said cross member spanning said body in upwardly spaced relation to said body and said leads;
   a plurality of stiff upstanding metal terminals carried by said bridge; and
   means connecting said terminals to respective contacts on said plate.

* * * * *